(12) United States Patent
Eilert

(10) Patent No.: US 6,909,645 B2
(45) Date of Patent: Jun. 21, 2005

(54) CLUSTER BASED REDUNDANCY SCHEME FOR SEMICONDUCTOR MEMORIES

(75) Inventor: Sean S. Eilert, Penryn, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/196,401

(22) Filed: Jul. 16, 2002

(65) Prior Publication Data

US 2004/0013007 A1 Jan. 22, 2004

(51) Int. Cl.$^7$ .................................................. G11C 7/00
(52) U.S. Cl. ......................................... 365/200; 365/63
(58) Field of Search .................. 365/200, 63, 189.07, 365/225.7

(56) References Cited

U.S. PATENT DOCUMENTS

| | | | | |
|---|---|---|---|---|
| 5,519,657 A | * | 5/1996 | Arimoto | 365/200 |
| 5,528,540 A | * | 6/1996 | Shibata et al. | 365/200 |
| 5,793,683 A | * | 8/1998 | Evans | 365/200 |
| 5,815,449 A | * | 9/1998 | Taura | 365/200 |
| 6,104,648 A | * | 8/2000 | Ooishi | 365/200 |
| 6,367,030 B1 | * | 4/2002 | Yamauchi | 714/7 |
| 6,522,590 B2 | * | 2/2003 | Matsui et al. | 365/200 |

* cited by examiner

*Primary Examiner*—Son T. Dinh
(74) *Attorney, Agent, or Firm*—Trop, Pruner & Hu, P.C.

(57) ABSTRACT

In some embodiments, a cluster redundancy scheme may be implemented. Such a scheme may provide cluster segments including rows and columns of replacement memory elements to selectively replace defective elements arranged in rows, columns, or blocks in a main memory array of a semiconductor memory.

24 Claims, 4 Drawing Sheets

CLUSTER BASED REDUNDANCY SCHEME FOR SEMICONDUCTOR MEMORIES

BACKGROUND

This invention relates generally to semiconductor memories and, particularly, to schemes for repairing bad memory locations in semiconductor memories.

Conventionally, redundancy may be provided for semiconductor memories to replace bad memory locations with good redundant memory locations. In this way, it is not necessary to discard the entire semiconductor memory just because some number of rows, columns, or cells within the memory have bad memory locations. This dramatically increases the yield of conventional semiconductor memories. For example, some memories, such as flash memories, may include redundant rows, which are extra rows within an erase block that can be used to replace defective rows within the same erase block. Similarly, redundant columns are extra columns within an erase block that can be used to replace defective columns within the same erase block. Likewise, redundant blocks are extra erase blocks on a flash device that can be used to replace defective blocks that cannot be repaired with column and/or row redundancy.

Most schemes provide multiple types of redundant elements (e.g. one scheme would have redundant rows and redundant columns. Another scheme might have redundant segments and redundant rows). However, each of these redundancy schemes is limited to a specific type of defect. Thus, some schemes may provide block redundancy, other schemes provide row redundancy, and still other schemes provide column redundancy. To the extent that the defect does not fit well within to the available fixed redundancy scheme, it may be awkward or impossible to provide adequate remediation.

Thus, there is a need for more flexible ways to provide redundancy for semiconductor memories.

DETAILED DESCRIPTION

Figure 1:
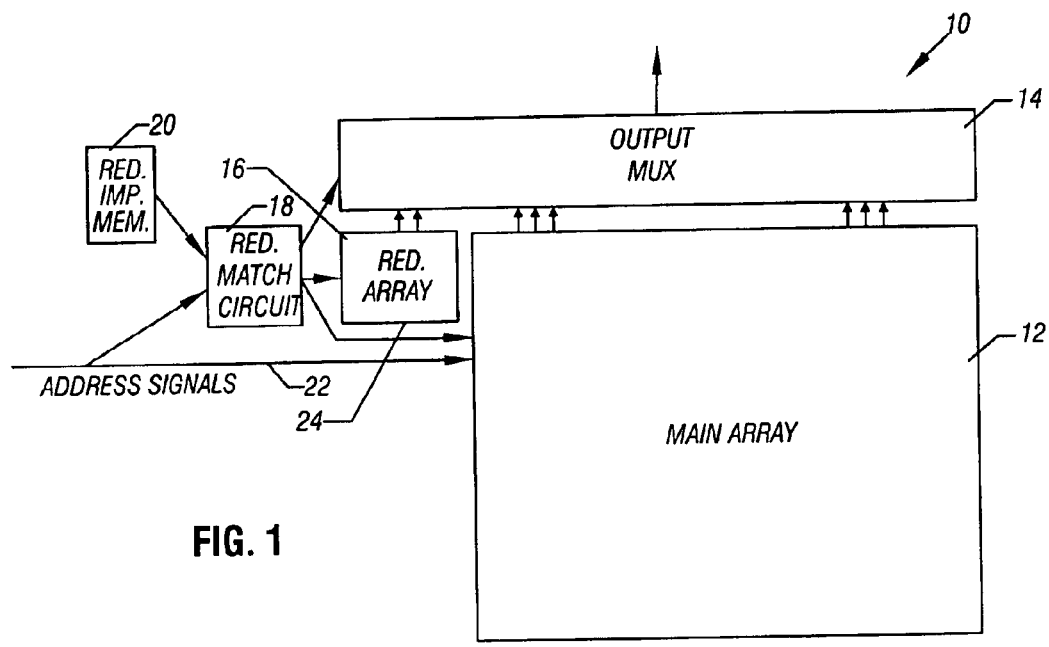
FIG. 1 is a schematic depiction of one embodiment of the present invention.
Figure 2:
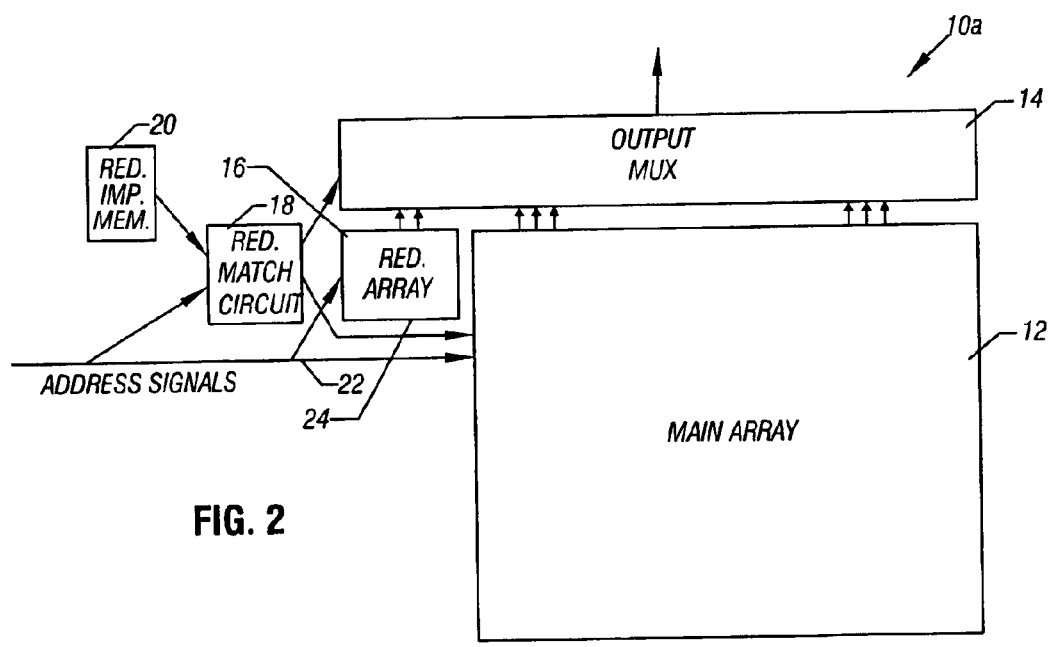
FIG. 2 is a schematic depiction of another embodiment of the present invention.

Referring to FIG. 1, a semiconductor memory 10 may include a main array 12 made up of storage locations. In one embodiment of the present invention, the main array 12 may be made up of a bit-alterable memory such as a phase change memory. The main array 12 is coupled to an output multiplexer 14. The output multiplexer is used to output appropriate redundant data in the event that redundancy is active and otherwise to output data from the main array 12.

Address signals 22 may be provided to the main array 12 to select memory locations. Those address signals 22 are also provided to a redundancy matching circuit 18. The redundancy matching circuit 18 determines, based on the applied address signals and the contents of a redundancy implementation memory 20, whether or not a redundancy match has occurred. In the event a match has occurred, the circuit 18 determines which redundant element to use. The data output from the circuit 18 is used to deselect main array 12 cells and to select redundant array 24 cells.

The redundancy implementation memory 20 may be non-volatile memory elements used to store information defining the logical placement of redundant clusters within the main array 12. These storage elements may be content addressable memory (CAM) cells such as flash memory, fuses, or specially designed circuits, such as those available using phase change memories.

A segment is a region of memory consisting of whole rows (wordlines) and whole columns (local bitlines). A cluster is a region of memory within a segment. For a given design all segments are logically divided into clusters.

The redundant array 16 includes one or more segments or partial segments of extra memory to be used as replacement elements for defective main array 12 elements. In accordance with one embodiment of the present invention, a cluster based redundancy scheme may be implemented wherein a redundant segment (or partial redundant segment) may be used to emulate row repair, column repair, or block repair. The redundant segment may be divided into a relatively small number of memory clusters. In one embodiment, thirty-two clusters of 256 bits×256 bits may be utilized.

By programming redundancy implementation memory 20 appropriately, these clusters can be organized side by side such that they form a row to repair a set of 256 adjacent rows. Likewise, they can be organized one on top of the other to form a column to make column repairs to repair a set of up to 256 adjacent columns. For example, the repair may be done within a segment or down an entire memory column. Alternatively, they can be organized to repair an entire memory segment in the same geometry as the redundant array, or they can be used independently to repair a large number of cluster defects.

In accordance with some embodiments of the present invention, costs may be reduced by using cluster redundancy. Assuming block redundancy is required for a given memory technology, cluster redundancy may eliminate the need to implement row and/or column redundancy in some embodiments. In addition, cluster redundancy may exhibit reduced complexity in some embodiments. Implementation of all redundancy using clusters may reduce the complexity of the design, testing, and qualification. In some embodiments, column and row redundancy schemes are limited in their ability to repair defects of increasing size. A defect affecting cells on ten columns, for example, may not be repaired on a design with only eight redundant column elements per segment. Therefore, repair efficiency may be improved with cluster redundancy.

When an address signal is received, the redundancy matching circuit 18 compares the redundancy implementation memory 20 contents to the subset of address signals. In a case of a match, the appropriate address is outputted to the redundant array 16 and the corresponding main array 12 element is switched off, while the redundant array 16 data is output on the appropriate input/output line to the output multiplexer 14.

In accordance with another embodiment of the present invention, instead of providing the address signals only to the redundancy matching circuit 18, those signals may also be applied directly to the redundant array 16. This implementation may be less flexible but may provide faster access in some embodiments. In addition, the design may be simplified in some cases.

Figure 3A:
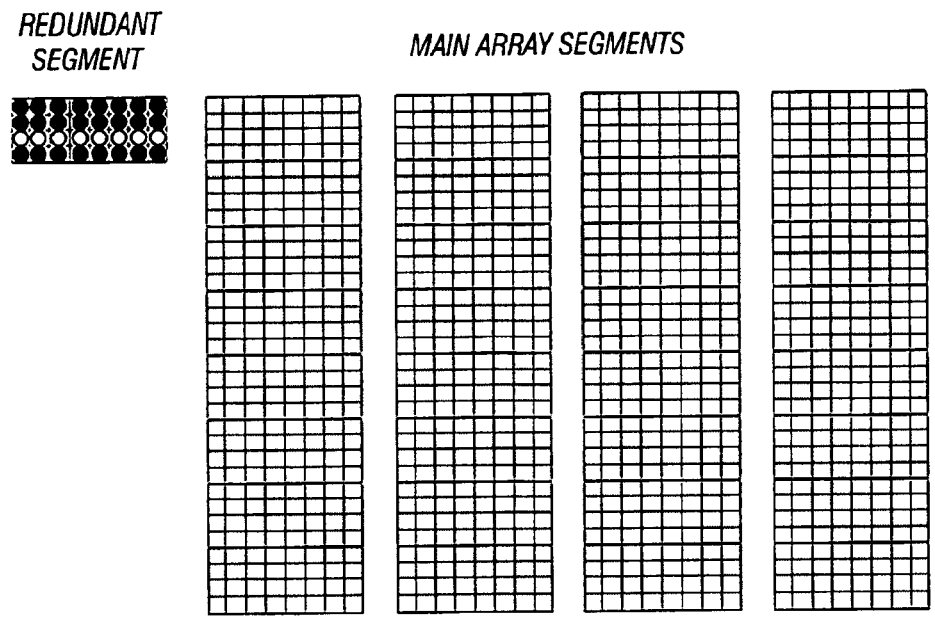
FIG. 3A shows a redundant segment for a main memory array in the situation where no repair was implemented in accordance with one embodiment of the present invention.

Referring to FIG. 3A, a redundant segment may be provided with eight columns and four rows of clusters in accordance with one embodiment of the present invention. The main array may include four planes, each including eight segments in one embodiment of the present invention. In the example illustrated in FIG. 3A, none of the redundant segments are utilized because no repair was implemented.

Figure 3B:
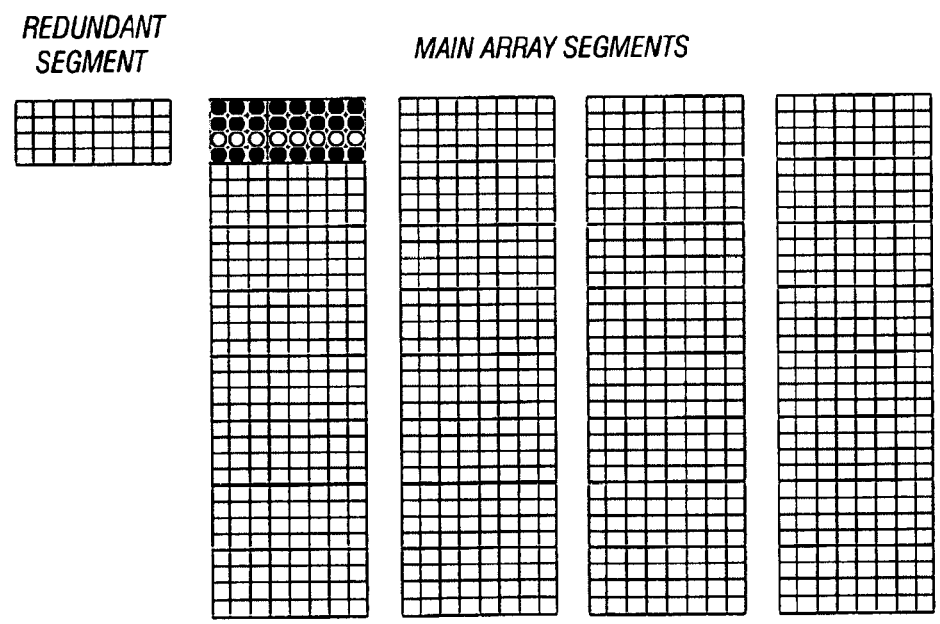
FIG. 3B shows a redundant segment being utilized to replace a segment in a main array in accordance with one embodiment of the present invention.

Referring to FIG. 3B, the redundant segment is utilized to repair an entire segment in the main array. In other words, the redundant segment is utilized in place of an entire main array segment as indicated in FIG. 3B.

Figure 3C:
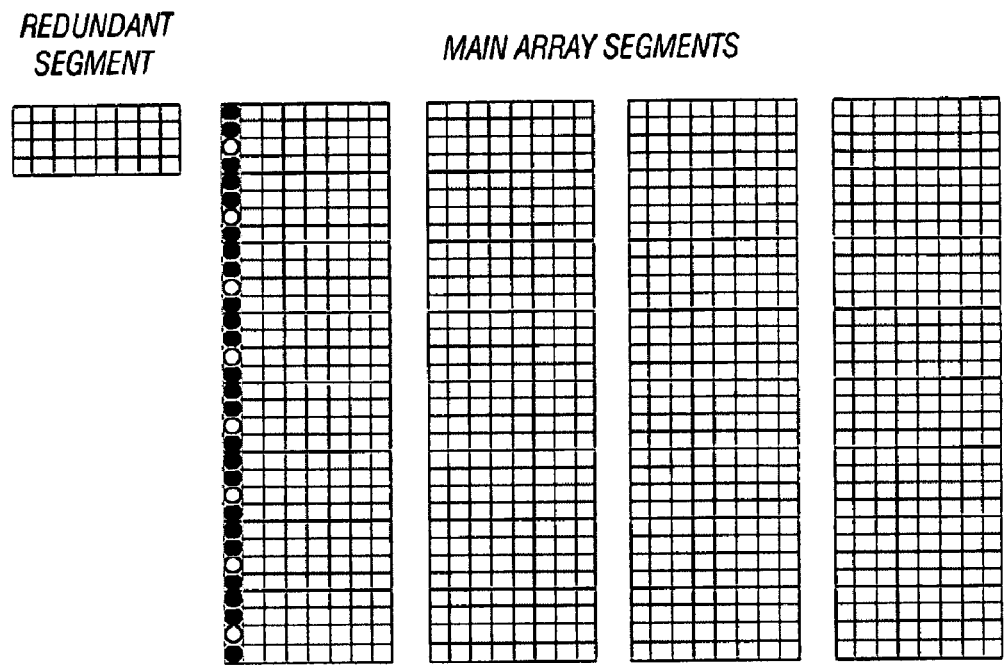
FIG. 3C shows a redundant segment utilized to replace a column in a main array in accordance with one embodiment of the present invention.

Referring to FIG. 3C, a global column repair is implemented. In this case, the eight segments, one on top of the other in the main array, may be repaired by using the entire redundant segment.

Figure 3D:
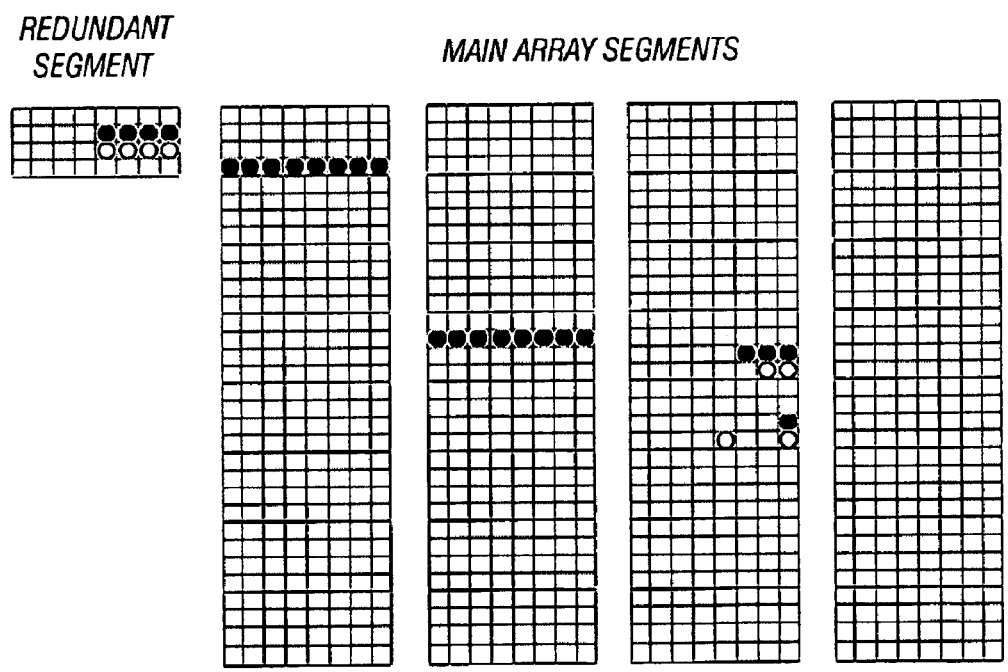
FIG. 3D shows a redundant segment utilized to replace a plurality of defective elements in main array rows and clusters in accordance with another embodiment of the present invention.

Referring next to FIG. 3D, rows and clusters may be repaired using all of the redundant segment except for the eight locations indicated by circles. Thus, in the first column of main array segments, a row may be repaired, for example, using the top row of the redundant segment. In the next column of array segments, another row may be repaired, for example, using the bottom row of the redundant segment. Finally, a plurality of clusters of repairs may be done using the second and third rows of the redundant segment.

Figure 3E:
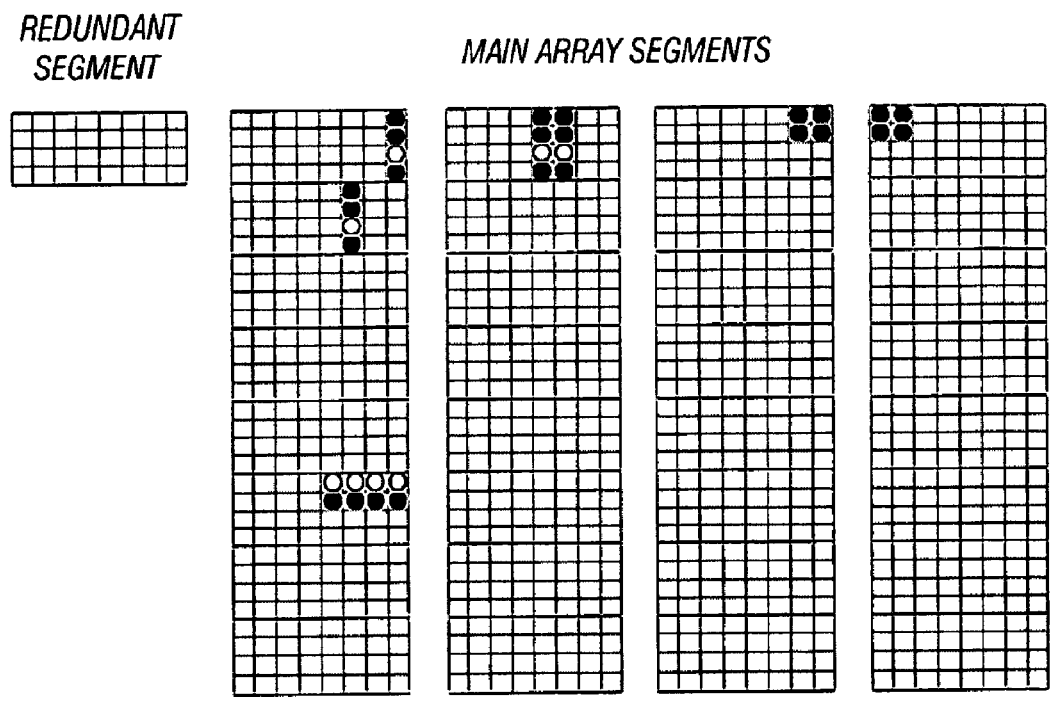
FIG. 3E shows an example where a redundant segment is utilized to replace a plurality of defective segments in columns and clusters in a main memory array, in accordance with one embodiment of the present invention.

Referring to FIG. 3E, a variety of column and cluster repairs may be implemented using the entire redundant segment. Thus, a plurality of columns of the redundant segment may be utilized to repair the four sets of defects that are arranged in a column formation in the main array. The remaining four columns of the redundant segment may be utilized to repair the row of like defects in the first column of main array and the cluster defects in the remaining memory array segments.

In some embodiments, an analysis may be done to determine the optimal amount of redundancy that can be utilized. Once defect densities are defined, the scheme can be scaled to provide an optimal amount of redundancy for any given device. The clusters can be logically organized on a die-by-die basis to form groups of rows, groups of columns, entire array segments, or scattered clusters. Thus, this implementation may be much more effective at repairing real-world defects.

Figure 4:
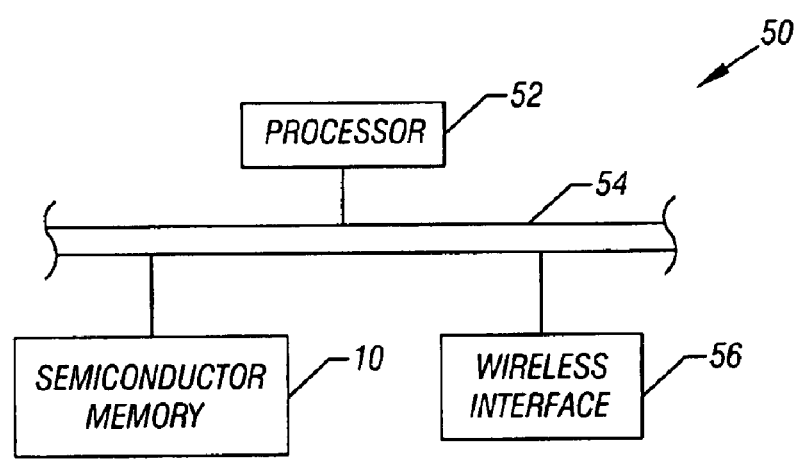
FIG. 4 is a schematic view of a system according to one embodiment of the present invention.

Referring to FIG. 4, a processor-based system 50, in accordance with one embodiment of the present invention, may include the semiconductor memory 10 coupled via a bus 54 to a processor 52, such as a digital signal processor, and a wireless interface 56. The system 50, for example, may be a cellular telephone or any of a variety of wireless devices including those used for wireless communications or wireless networking, as examples.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a cluster redundancy segment including redundant memory elements arranged in rows and columns; and
   replacing defective memory elements within a main memory array of a semiconductor memory by assigning elements in said cluster redundancy segment to emulate one of row repair, column repair, or block repair based on a type of the defective memory elements.

2. The method of claim 1 wherein replacing defective memory elements includes replacing defective memory elements arranged in a row with a row from said cluster redundancy segment.

3. The method of claim 1 wherein replacing defective memory elements includes replacing defective memory elements arranged in a column with a column of elements in said cluster redundancy segment.

4. The method of claim 3 including using a plurality of columns in said cluster redundancy segment to replace a column of defective memory elements in a main memory array.

5. The method of claim 1 including detecting an address signal and determining whether said address signal addresses a memory element in said main array which has been replaced with a redundant memory element in said cluster redundancy segment.

6. The method of claim 5 including outputting data from a redundant array when the address signal addresses an element in said main array which is defective.

7. The method of claim 6 including detecting said address signal at a redundancy matching circuit that compares redundancy implementation information with said address signal.

8. The method of claim 7 including receiving said address signal in said redundancy matching circuit and said redundant array.

9. A semiconductor memory comprising:
   a main array including a plurality of memory elements arranged in rows and columns;
   a redundant array including at least one set of memory elements arranged in rows and columns; and
   a device to determine if a defective cluster is addressed in said main array and to instead address a cluster of said redundant array to emulate one of row repair, column repair, and block repair based on a type of the defective cluster.

10. The memory of claim 9 wherein said device to replace a row in said main array with a row in said redundant array.

11. The memory of claim 10 wherein said device to replace a row in said main array with a plurality of rows in said redundant array.

12. The memory of claim 9 wherein said device to replace a column in said main array with a column in said redundant array.

13. The memory of claim 12 wherein said device to replace a column in said main array with a plurality of columns in said redundant array.

14. The memory of claim 9 including a redundancy matching circuit coupled to receive array address signals.

15. The memory of claim 14 wherein said redundant array is coupled to said redundancy matching circuit.

16. The memory of claim 14 wherein said redundant array is coupled to receive said array address signals.

17. A processor-based system comprising:

a processor;

a semiconductor memory coupled to said processor including a main array with a plurality of memory elements arranged in rows and columns, a redundant array including at least one set of memory elements arranged in rows and columns, and a device to determine if a defective cluster is addressed in said main array and instead to address a cluster of said redundant array to emulate one of row repair, column repair, and block repair based on a type of the defective cluster; and a wireless interface coupled to said processor.

18. The system of claim 17 wherein said device to replace a row in said main array with a row in said redundant array.

19. The system of claim 18 wherein said device to replace a row in said main array with a plurality of rows in said redundant array.

20. The system of claim 17 including said device to replace a column in said main array with a column in said redundant array.

21. The system of claim 20 including said device to replace a column in said main array with a plurality of columns in said redundant array.

22. The system of claim 17 including a redundancy matching circuit coupled to receive array address signals.

23. The system of claim 22 wherein said redundant array is coupled to said redundancy matching circuit.

24. The system of claim 22 wherein said redundant array is coupled to receive said array address signals.

* * * * *